US008072758B2

(12) United States Patent
Groppo et al.

(10) Patent No.: US 8,072,758 B2
(45) Date of Patent: Dec. 6, 2011

(54) AUTOMOTIVE INVERTER ASSEMBLY

(75) Inventors: Riccardo Groppo, Orbassano (IT);
Giuseppe Catona, Orbassano (IT);
Andrea Pizzato, Orbassano (IT)

(73) Assignee: C.R.F. Societa Consortile per Azioni, Orbassano (IT)

( * ) Notice: Subject to any disclaimer, the term of this patent is extended or adjusted under 35 U.S.C. 154(b) by 11 days.

(21) Appl. No.: 12/573,965

(22) Filed: Oct. 6, 2009

(65) Prior Publication Data
US 2010/0128437 A1 May 27, 2010

(30) Foreign Application Priority Data

Oct. 24, 2008 (EP) .................................... 08425690
Jul. 9, 2009 (EP) .................................... 09165081

(51) Int. Cl.
*H05K 7/20* (2006.01)
(52) U.S. Cl. .................. 361/703; 361/679.53; 361/689; 361/699; 165/80.4; 165/80.5; 165/104.33
(58) Field of Classification Search ............. 361/679.46, 361/679.53, 688, 689, 698, 699, 702–712, 361/734, 763, 766, 775, 782, 793, 794, 56.02, 361/137, 141, 144–147; 165/80.3, 80.4, 165/80.5, 104.33, 104.34, 185; 174/16.3, 174/35, 50, 50.52, 58, 35 R, 35 GC; 310/54; 62/228.1, 259.2; 257/706, 713, 714, 718; 29/592.1, 740, 741, 759, 831, 557; 307/9.1, 307/10.1, 45, 58, 82, 147
See application file for complete search history.

(56) References Cited

U.S. PATENT DOCUMENTS

| 5,349,498 | A | * | 9/1994 | Tanzer et al. ................. 361/689 |
| 5,504,378 | A | * | 4/1996 | Lindberg et al. ............. 307/10.1 |
| 5,585,681 | A | * | 12/1996 | Bitsche .......................... 310/54 |
| 5,631,821 | A | * | 5/1997 | Muso ............................ 363/141 |
| 5,740,015 | A | * | 4/1998 | Donegan et al. ............. 361/699 |
| 5,828,554 | A | * | 10/1998 | Donegan et al. ............. 361/707 |
| 5,923,085 | A | * | 7/1999 | Donegan et al. ............. 257/712 |
| 5,966,291 | A | * | 10/1999 | Baumel et al. ................ 361/707 |
| 5,978,220 | A | * | 11/1999 | Frey et al. ..................... 361/699 |
| 6,141,219 | A | * | 10/2000 | Downing et al. ............. 361/704 |
| 6,166,937 | A | * | 12/2000 | Yamamura et al. ........... 363/141 |
| 6,213,195 | B1 | * | 4/2001 | Downing et al. ............. 165/80.4 |
| 6,219,245 | B1 | * | 4/2001 | Nagashima et al. .......... 361/705 |
| 6,313,991 | B1 | * | 11/2001 | Nagashima et al. .......... 361/699 |
| 6,414,867 | B2 | * | 7/2002 | Suzuki et al. ................. 363/141 |

(Continued)

FOREIGN PATENT DOCUMENTS

EP        1538730 A      6/2005

(Continued)

OTHER PUBLICATIONS

European Search Report dated Feb. 9, 2010 as issued in EP Application No. 09165081.

*Primary Examiner* — Michail V Datskovskiy
(74) *Attorney, Agent, or Firm* — Workman Nydegger

(57) ABSTRACT

In an embodiment, an automotive inverter assembly has at least one component for cooling. The inverter assembly has a supporting body for supporting the at least one component. The supporting body defines at least part of a volume through which flows a cooling fluid coupled thermally with the at least one component for cooling.

14 Claims, 11 Drawing Sheets

U.S. PATENT DOCUMENTS

| | | | |
|---|---|---|---|
| 6,442,023 B2 * | 8/2002 | Cettour-Rose et al. | 361/690 |
| 6,496,393 B1 * | 12/2002 | Patwardhan | 363/70 |
| 6,529,394 B1 * | 3/2003 | Joseph et al. | 363/141 |
| 6,618,278 B2 * | 9/2003 | Suzuki et al. | 363/144 |
| 6,621,701 B2 * | 9/2003 | Tamba et al. | 361/699 |
| 6,661,659 B2 * | 12/2003 | Tamba et al. | 361/699 |
| 6,822,850 B2 * | 11/2004 | Pfeifer et al. | 361/611 |
| 6,906,935 B2 * | 6/2005 | Nakamura et al. | 363/144 |
| 6,956,742 B2 * | 10/2005 | Pfeifer et al. | 361/709 |
| 6,965,514 B2 * | 11/2005 | Beihoff et al. | 361/699 |
| 7,090,044 B2 * | 8/2006 | Nakamura et al. | 180/65.8 |
| 7,173,823 B1 | 2/2007 | Rinehart et al. | |
| 7,187,548 B2 * | 3/2007 | Meyer et al. | 361/699 |
| 7,211,912 B2 * | 5/2007 | Takenaka et al. | 310/54 |
| 7,343,884 B1 * | 3/2008 | Carney et al. | 123/41.54 |
| 7,453,695 B2 * | 11/2008 | Ohnishi et al. | 361/689 |
| 7,564,129 B2 * | 7/2009 | Nakanishi et al. | 257/722 |
| 7,569,957 B2 * | 8/2009 | Aoki et al. | 310/64 |
| 7,616,443 B2 * | 11/2009 | Walter | 361/699 |
| 7,660,122 B2 * | 2/2010 | Nakamura et al. | 361/699 |
| 7,710,721 B2 * | 5/2010 | Matsuo et al. | 361/699 |
| 7,728,467 B2 * | 6/2010 | Aoki et al. | 310/54 |
| 7,742,303 B2 * | 6/2010 | Azuma et al. | 361/699 |
| 7,760,503 B2 * | 7/2010 | Aoki et al. | 361/699 |
| 7,830,689 B2 * | 11/2010 | Nakamura et al. | 363/141 |
| 7,859,846 B2 * | 12/2010 | Hassani et al. | 361/702 |
| 2004/0150271 A1 | 8/2004 | Koga et al. | |
| 2008/0169088 A1 | 7/2008 | Aoki et al. | |
| 2008/0179972 A1 | 7/2008 | Aoki et al. | |

FOREIGN PATENT DOCUMENTS

| | | | |
|---|---|---|---|
| EP | 1956649 A | | 8/2008 |
| JP | 2005045027 A | * | 2/2005 |
| JP | 2007201225 A | * | 8/2007 |

* cited by examiner

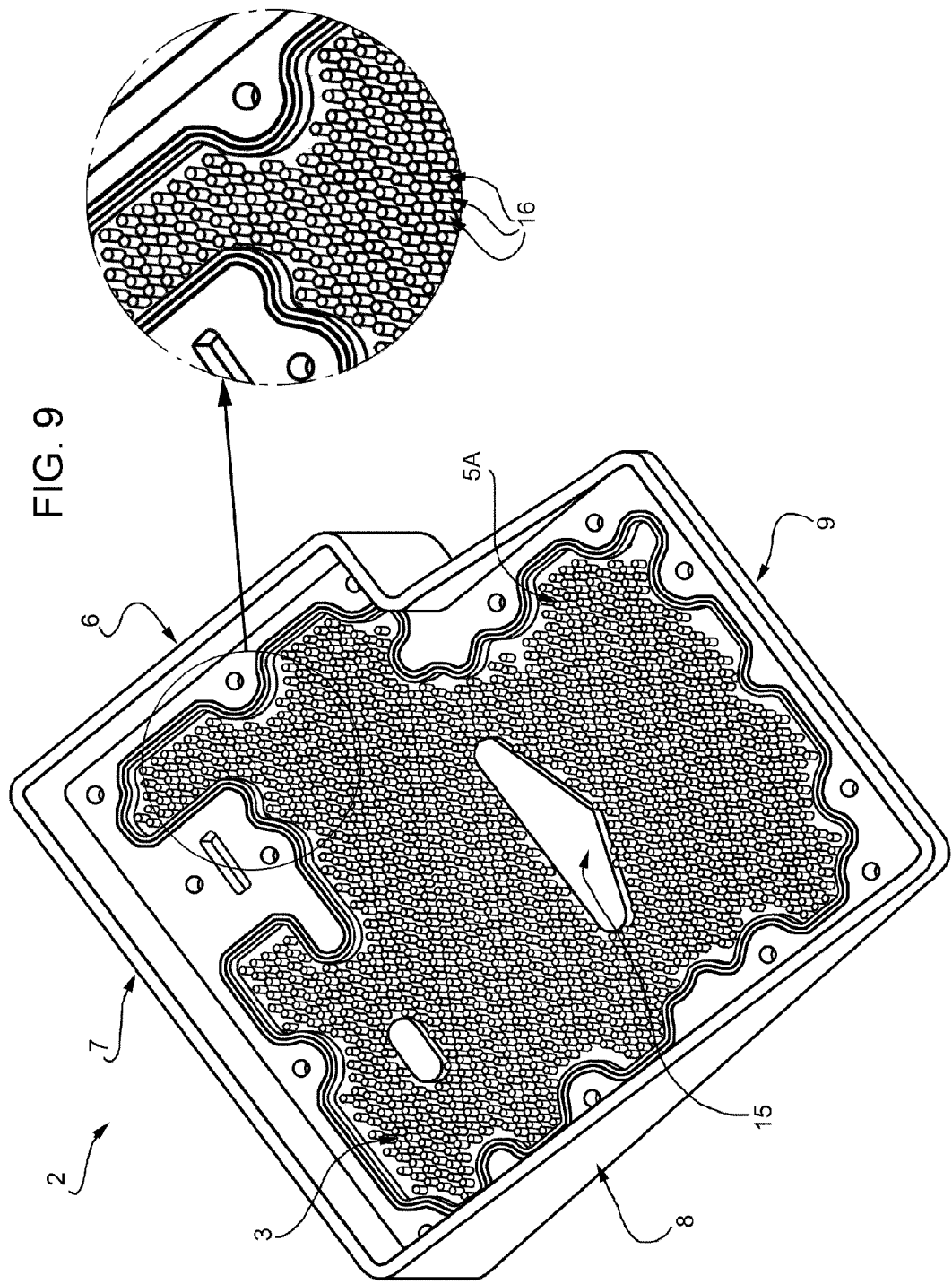

AUTOMOTIVE INVERTER ASSEMBLY

CROSS-REFERENCE TO RELATED APPLICATIONS

This application claims priority to European Patent Application No. 08425690.8 filed on 24 Oct. 2008 and European Patent Application No. 09165081.2 filed on 9 Jul. 2009, the disclosures of each of the foregoing applications are incorporated herein, in their entirety, by this reference.

TECHNICAL FIELD

One or more embodiments of the present invention relate to an automotive inverter assembly, in particular for an electric, hybrid or fuel-cell vehicle. One or more embodiments of the invention also relate to a propulsion system comprising such an inverter assembly, and to a vehicle equipped with such an inverter assembly.

BACKGROUND

A hybrid vehicle is a vehicle powered by two or more drive systems. Most commonly, the term refers to hybrid electric vehicles (HEVs) that feature a conventional drive system, such as an internal combustion engine, combined with one or more electric motors.

Of particular interest to researchers have been what are known as "plug-in" hybrid electric vehicles (PHEVs), i.e. vehicles which, in addition to a conventional (e.g. internal combustion) engine and an electric motor, also feature a system of batteries chargeable by plugging in to an electric power source.

PHEVs normally also comprise an electric drive system including a power inverter assembly; a low-voltage battery charger for charging a service battery from the high-voltage traction battery; and a high-voltage battery charger, connectable to the power mains, for charging the traction battery.

A PHEV normally employs connectors to supply electric power from the batteries (for which fuel cells may be substituted) to the internal combustion engine and other devices and electric systems on the vehicle.

The inverter assemblies of such vehicles serve to convert the direct current from the batteries or alternative sources to alternating current to power the vehicle user devices mentioned.

The electronic components of the inverter assembly, however, produce considerable heat, which must be removed to ensure correct operation and prevent overheating, which means the inverter assembly must be equipped with appropriate cooling means.

A need is felt within the industry for an inverter assembly, particularly for hybrid vehicles, designed to effectively dissipate the heat generated in use, and more effectively, for example, than conventional solutions employing a cooling coil.

A need is also felt for an inverter assembly, which is compact and lightweight, and provides for improving vehicle performance in terms of energy efficiency, consumption, and therefore environmental impact.

Finally, a need is also felt for an automotive inverter assembly that is potentially cheaper to produce by being easier to assemble.

SUMMARY

One or more embodiments of the present invention provide an automotive inverter assembly designed to meet at least one of the above requirements in a straightforward, low-cost manner. In an embodiment, an automotive inverter assembly includes at least one component for cooling. The inverter assembly includes a supporting body for supporting the at least one component. The supporting body defines at least part of a volume through which flows a cooling fluid coupled thermally with the at least one component for cooling.

BRIEF DESCRIPTION OF THE DRAWINGS

A preferred, non-limiting embodiment of the present invention will be described by way of example with reference to the accompanying drawings, in which:

FIGS. 6, 7, 8, 9 show views in perspective, from respective angles and with parts removed for clarity, of the FIG. 2-5 inverter assembly.

DETAILED DESCRIPTION

Figure 1:
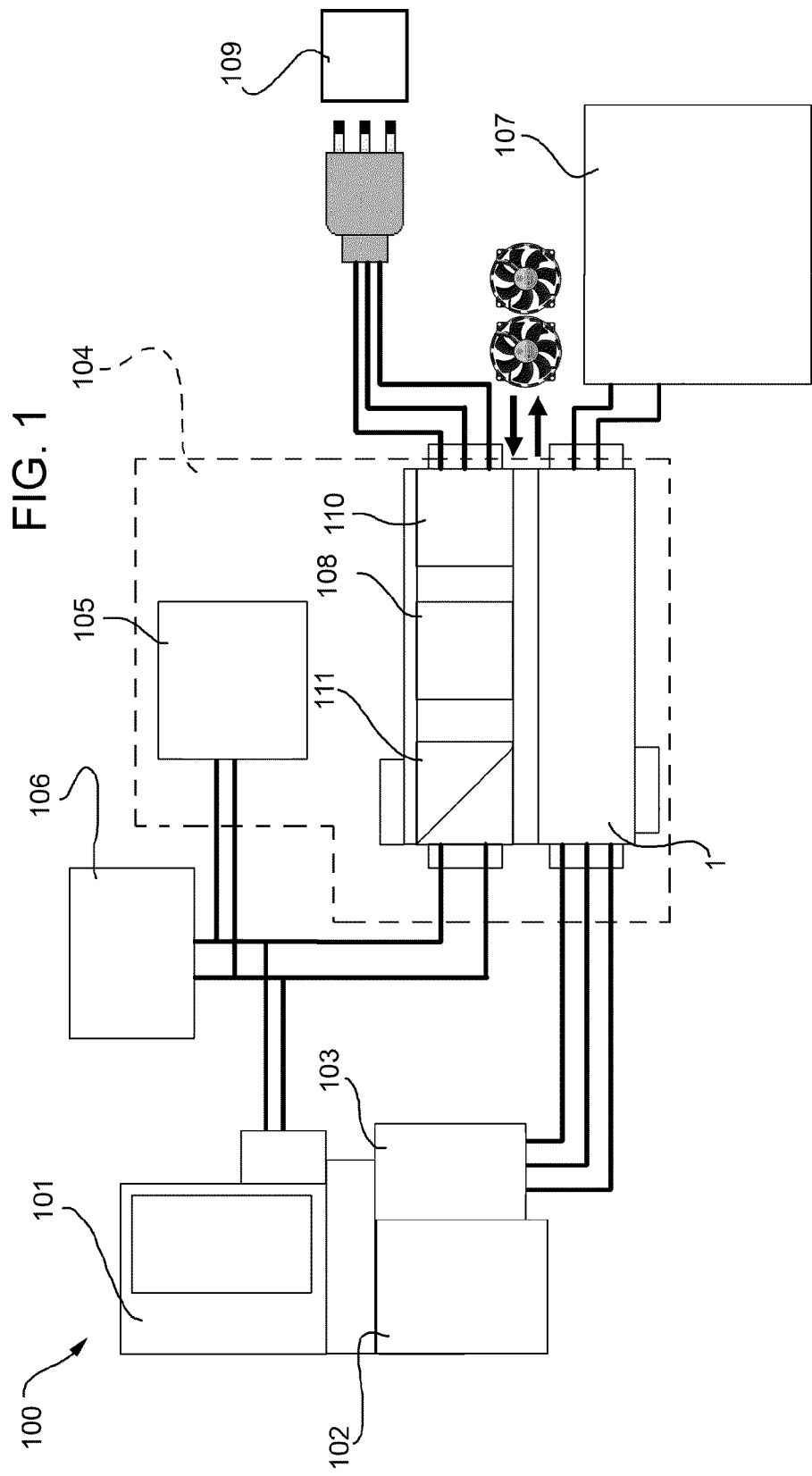
FIG. 1 shows an operating diagram of a drive comprising a first embodiment of an automotive inverter assembly in accordance with the invention.
Figure 2:
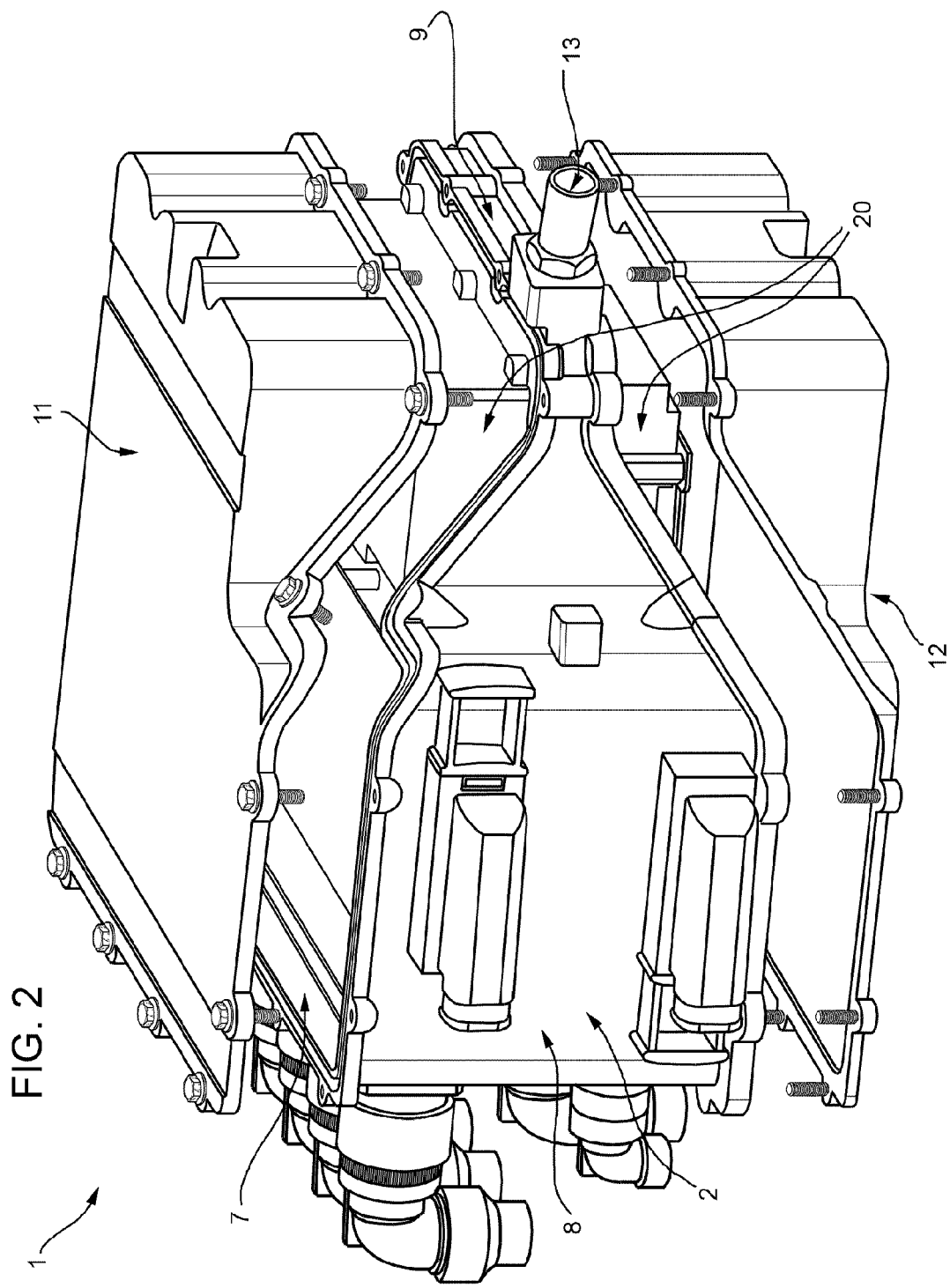
FIG. 2 shows a view in perspective of the FIG. 1 inverter assembly.
Figure 3:
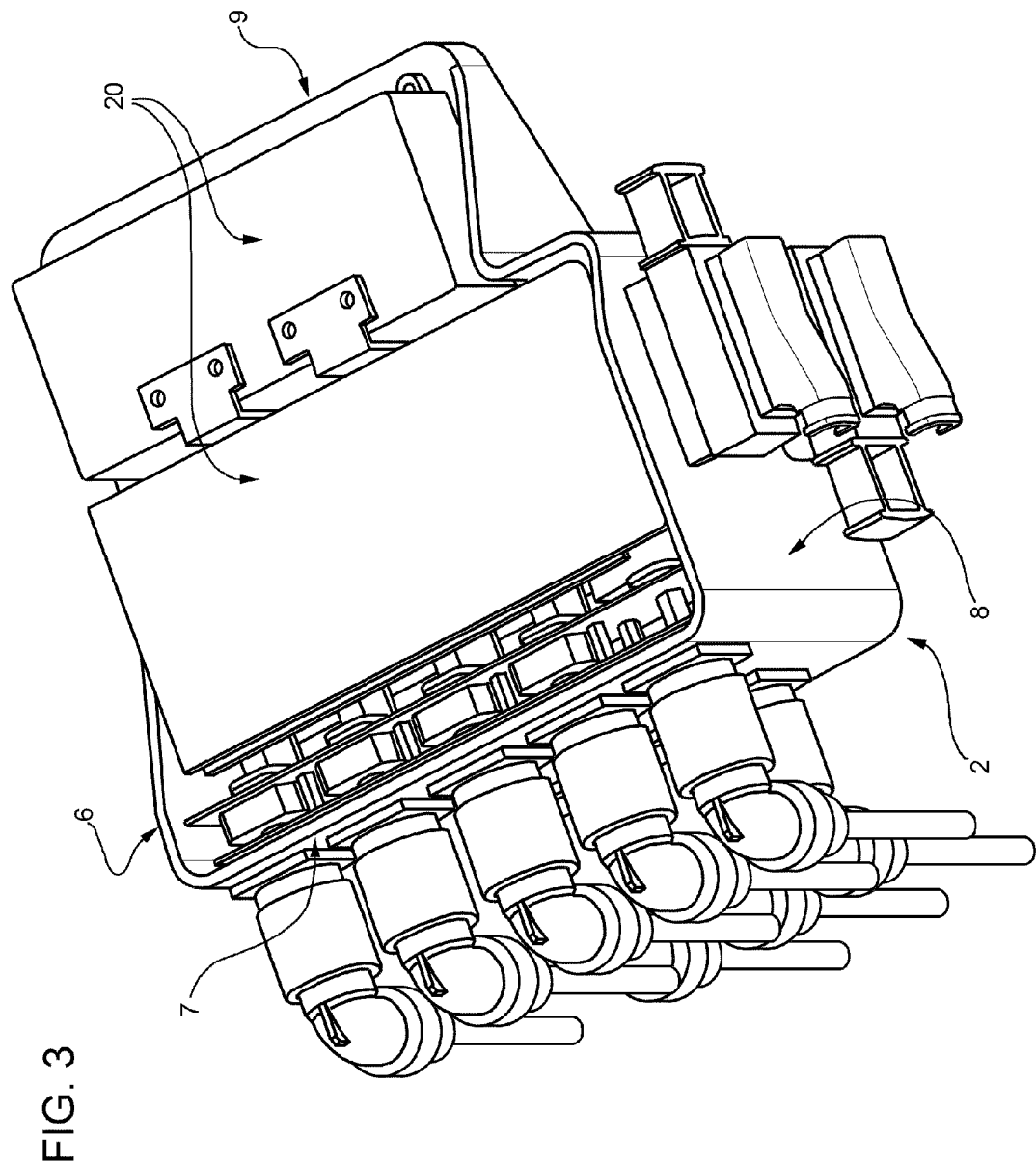
FIGS. 3 and 4 show views in perspective, from different angles, of the FIGS. 1 and 2 inverter assembly.
Figure 4:
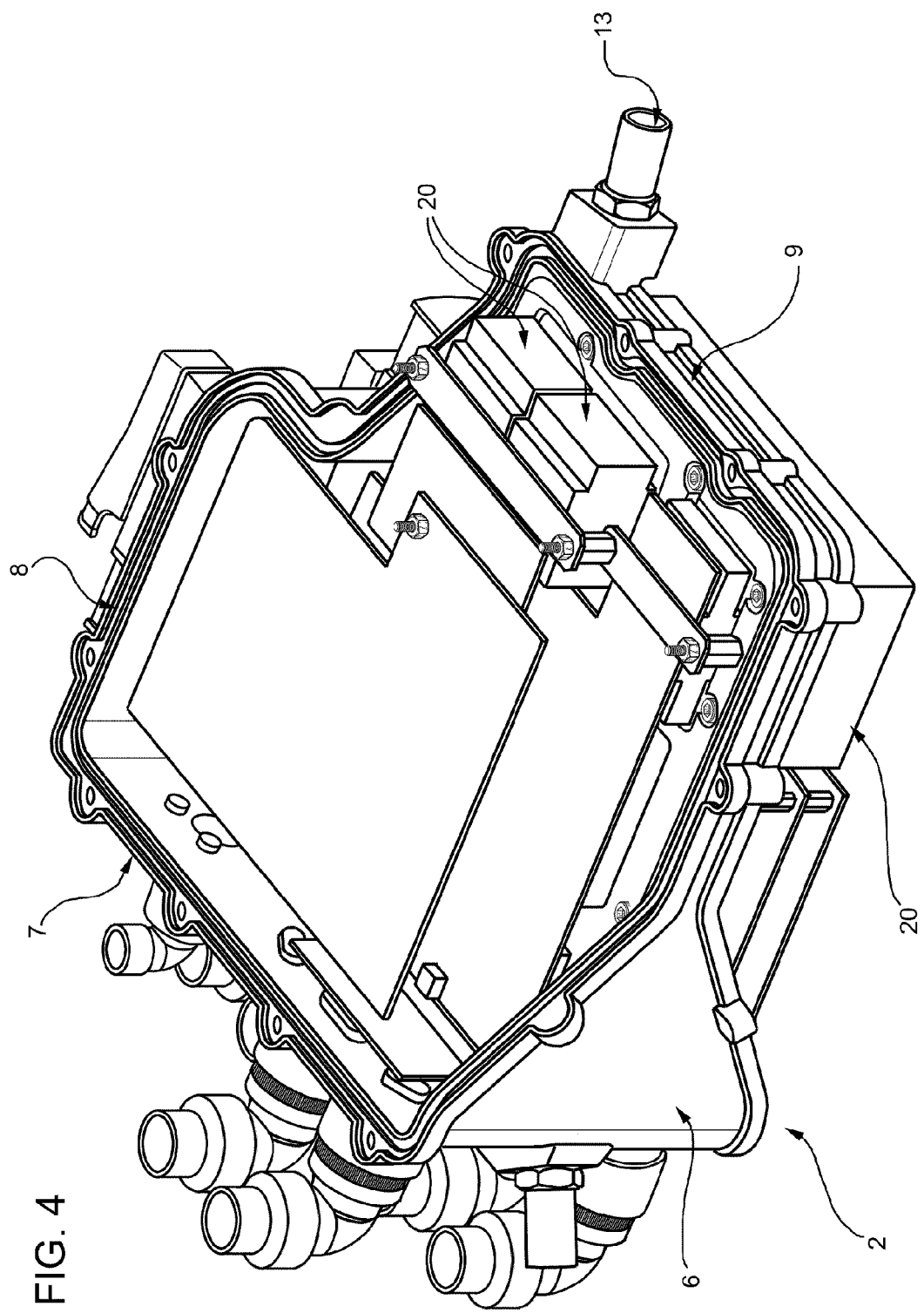
Figure 5:
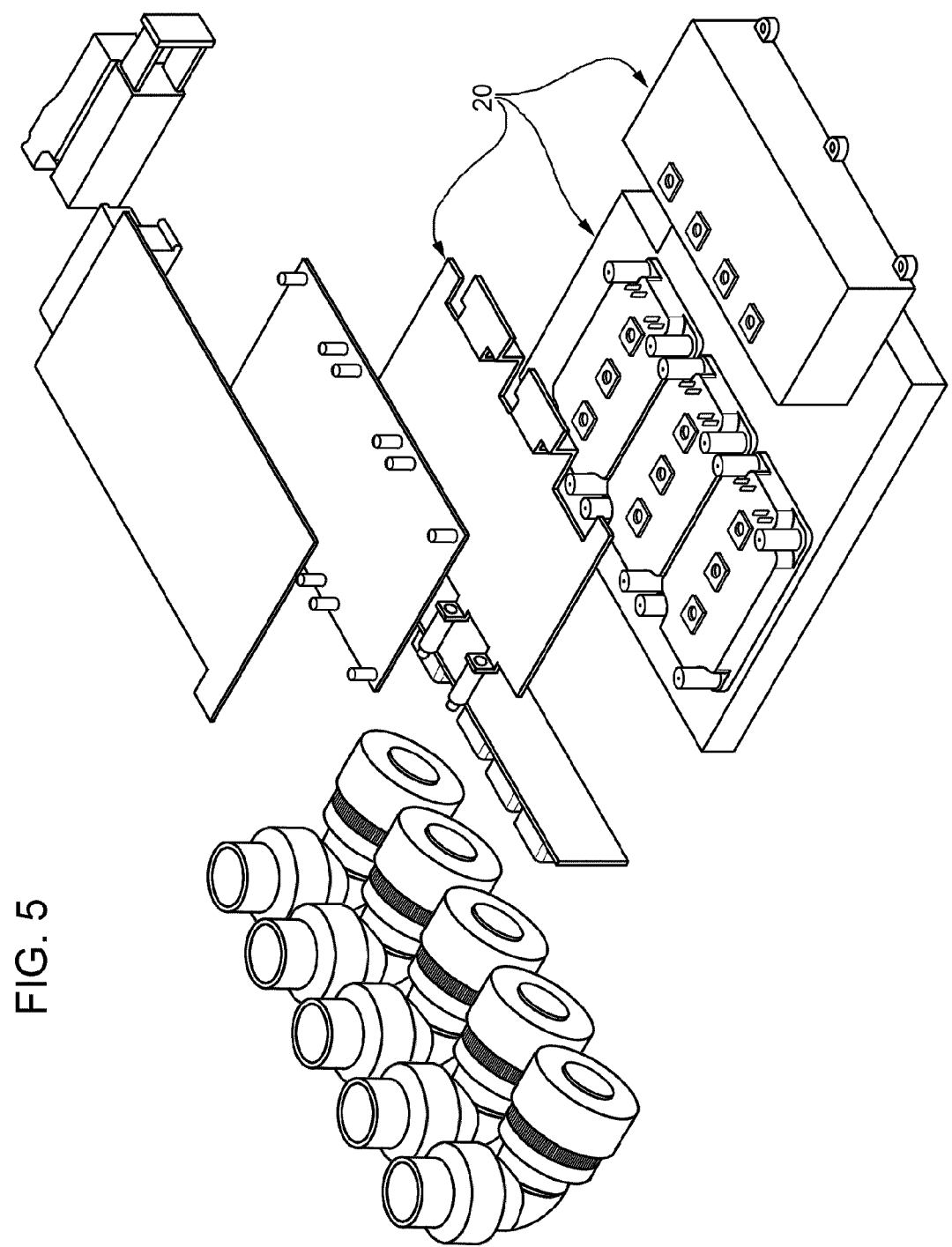
FIG. 5 shows an exploded view in perspective of the FIG. 2-4 inverter assembly.

FIG. 1 shows a propulsion system 100, for a hybrid vehicle (not shown), the propulsion system substantially comprising:
- a combustion engine 101 (e.g. a low-power petrol engine);
- a transmission 102, e.g. a dual dry clutch transmission (DDCT);
- an electric machine 103, which operates as a motor or electric generator, and can be activated to start combustion engine 101; and
- an electric power drive 104.

Electric drive 104 in turn comprises: an inverter assembly 1; a low-voltage battery charger 105 for charging a service battery 106 from a high-voltage traction battery 107; and a high-voltage battery charger 108 for charging traction battery 107, and which is connectable to the power mains 109, and substantially comprises an active power factor correction AC/DC converter 110 at the input, and a DC/DC converter 111 at the output.

The propulsion system 100 shown in FIG. 1 performs at least the following functions:
- turn-on/turn-off of combustion engine 101 by electric machine 103 operating as an electric drive motor;
- vehicle launch and creep in electric mode;
- economy gear shifting;
- regenerative braking; and
- electric torque boost.

In the example shown, transmission 102 is connected functionally to electric machine 103.

Inverter assembly 1 controls electric power flow to the system's motor-generator, and so supplies the necessary electric power when the vehicle is driven by electric machine 103 on its own or in conjunction with combustion engine 101. Inverter assembly 1 also controls electric machine 103 operating in electric generator mode during regenerative braking, to feed electric power to high-voltage battery 107.

Inverter assembly 1 comprises a number of electric/electronic components 20, including an IGBT module and a power capacitor on the high-voltage DC bus. In use, components 20 (FIGS. 2-9) produce considerable heat, which must be removed to avoid overheating and ensure the best operating conditions.

Inverter assembly 1 advantageously comprises a supporting body 2 for supporting components 20, and which defines at least part of a volume 3 (FIG. 6), through which flows a cooling fluid coupled thermally with components 20 for cooling.

Supporting body 2 comprises a first and second wall 4 and 5, substantially parallel and opposite, and which vertically define volume 3 therebetween.

First and second wall 4 and 5 of supporting body 2 are preferably connected releasably (e.g. by screws inserted inside threaded seats) and hermetically (e.g. with the interposition of a seal) along respective peripheries p.

Figure 6:
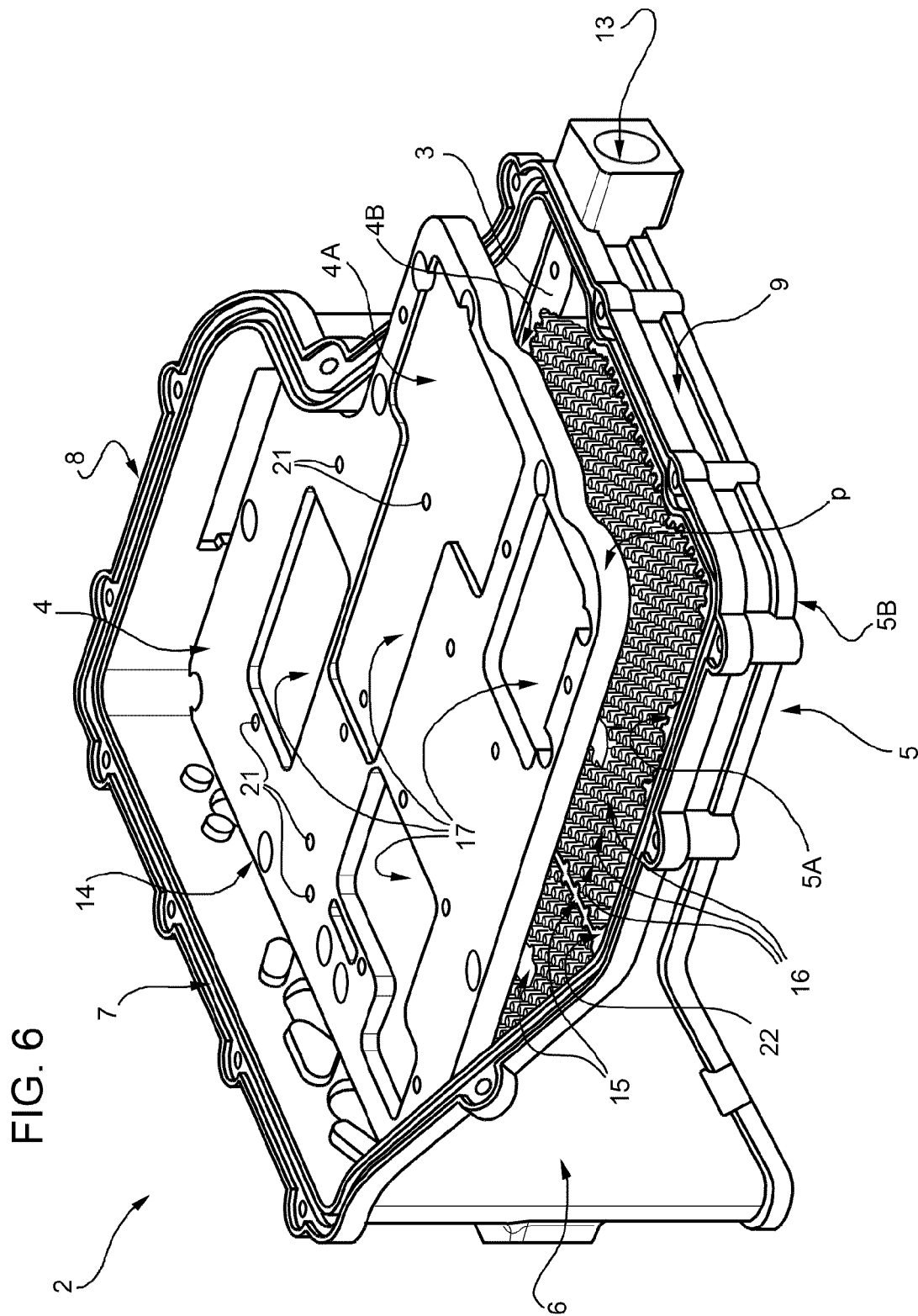

Wall 4 has a first face 4A and a second face 4B substantially parallel to each other, with face 4A located on top with reference to FIG. 6.

Similarly, wall 5 has a first face 5A and a second face 5B substantially parallel to each other, with face 5A located on top with reference to FIG. 6. Faces 4B and 5A are oppositely facing, and are flowed over by the cooling fluid.

Figure 7:
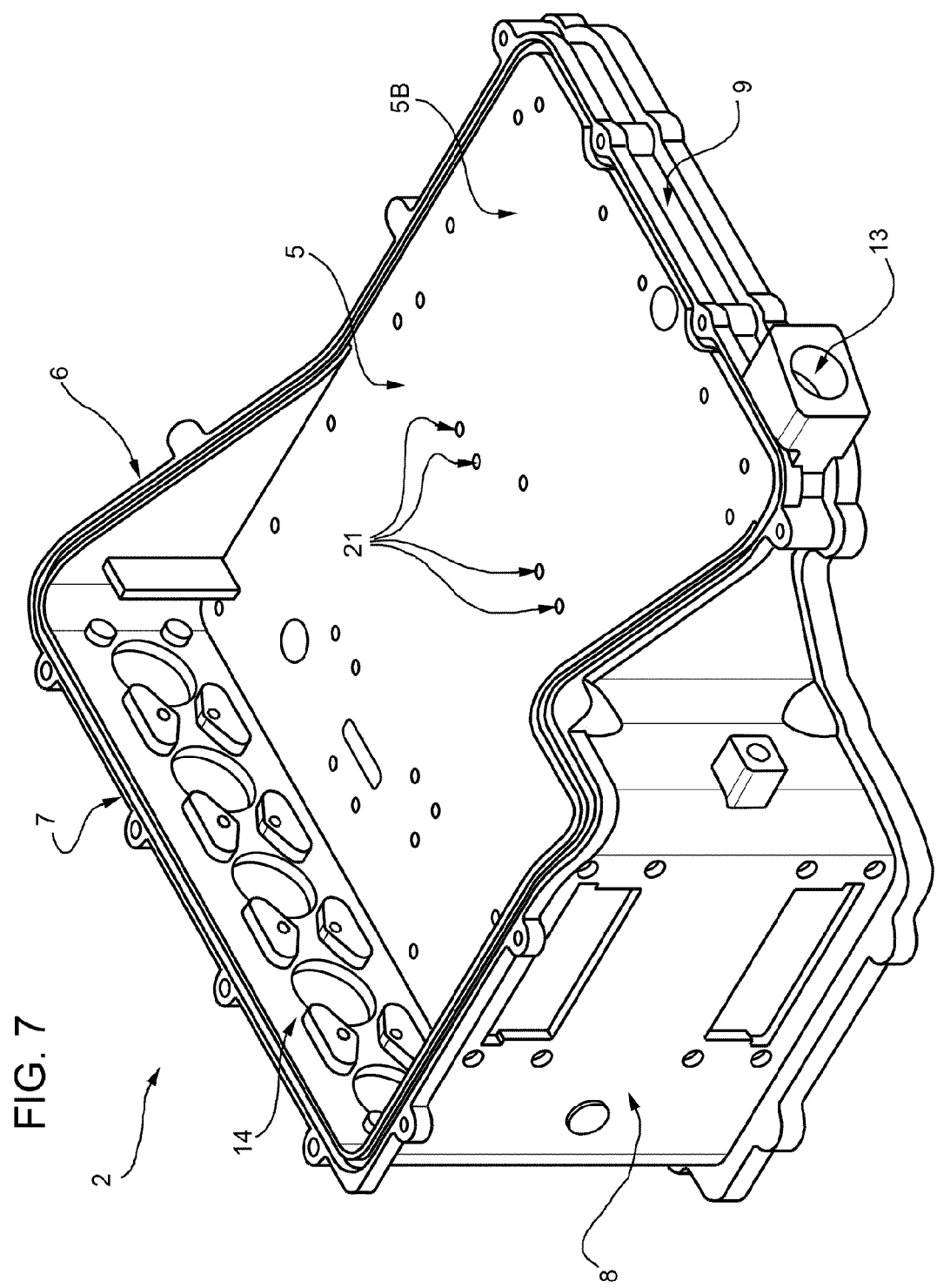

Supporting body 2 has fastening holes 21 on walls 4 and 5 for assembling components 20 (FIGS. 6 and 7).

Face 4A of wall 4 advantageously has a number of dead seats 17 for housing respective components 20 for cooling.

In the example shown, seats 17 are adjacent to holes 21.

Components 20 are thus coupled thermally with supporting body 2 and, in series with this, with the cooling fluid flowing through volume 3.

Seats 17 define thin portions of wall 4, i.e. of first wall 4 of supporting body 2.

At least one surface of volume 3 flowed over, in use, by the cooling fluid, e.g. top face 5A (FIGS. 6 and 8), preferably comprises a number of fins 16 facing inwards of volume 3, so as also to be flowed over by the cooling fluid.

Fins 16 increase the heat exchange surface per unit of volume, and promote turbulent flow of the cooling fluid, to advantageously improve heat exchange efficiency.

In the embodiment shown, fins 16 are defined by pegs substantially perpendicular to faces 5A and 4B and of a length substantially equal to the distance between walls 4 and 5.

Figure 8:
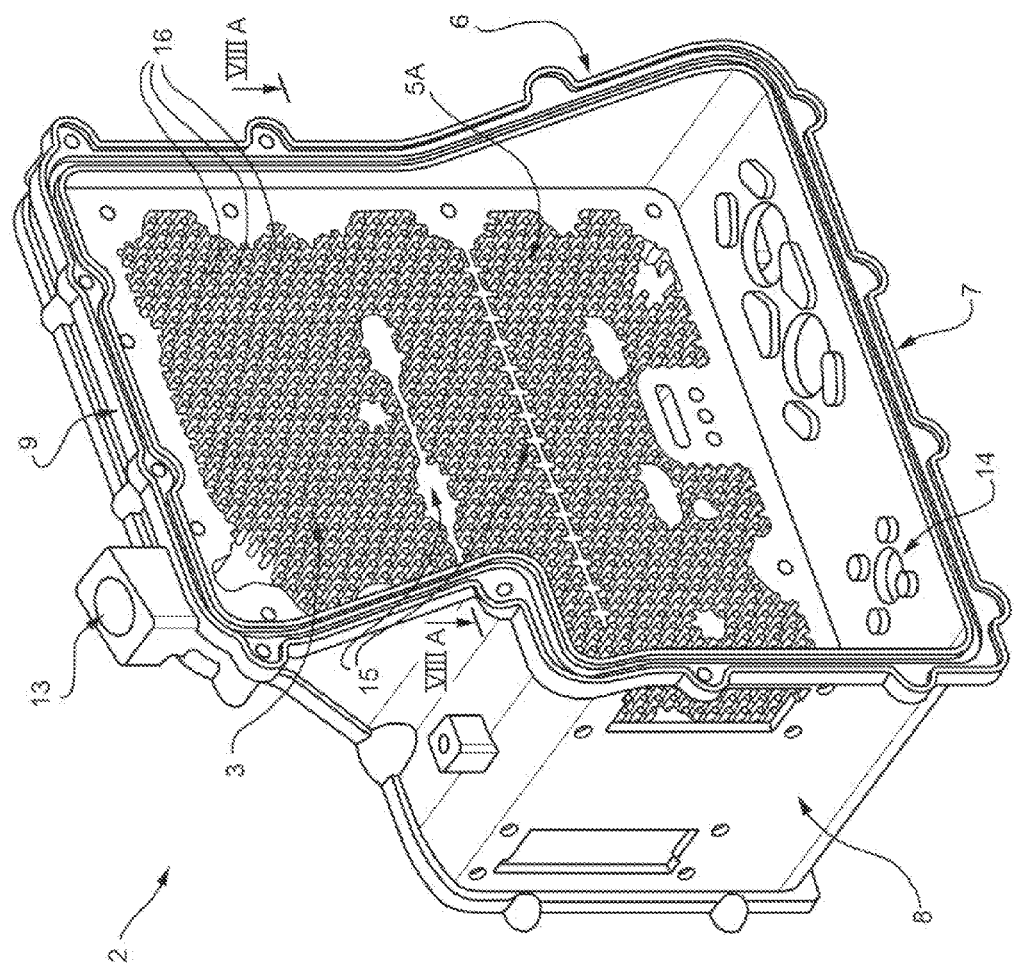
Figure 8A:
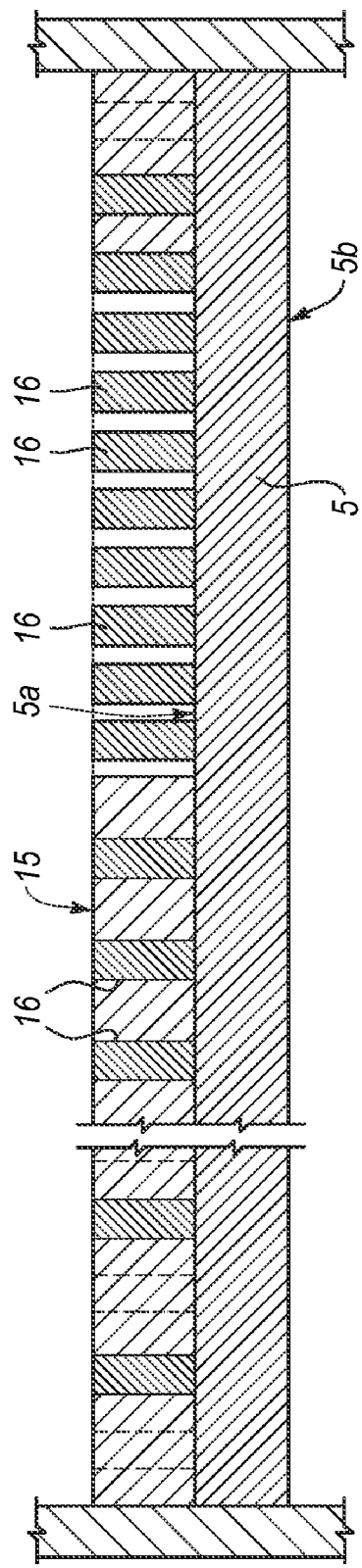
FIG. 8A is a cross-sectional view of the inverter assembly shown in FIG. 8 taken along section line VIIIA-VIIIA thereof.

As shown in FIGS. 8 and 8A, groups of fins 16 may conveniently be welded to one another at welds extending between walls 4 and 5, and which define deflectors 15 for directing the cooling fluid, in use, along a preferential path.

Alternatively, inverter assembly 1 may comprise deflectors 15 defined by one or more partitions inside volume 3, e.g. interposed between first and second wall 4 and 5.

The part of the cooling fluid prevented from flowing through deflectors 15 may thus be directed through volume 3 along a non-straight path.

Supporting body 2 also comprises lateral walls 6, 7, 8, 9, which are substantially perpendicular to first and second wall 4 and 5, are parallel two by two, and laterally define volume 3 through which the cooling fluid flows.

More specifically, volume 3 extends between walls 4 and 5 and the portions of walls 6, 7, 8, 9 defined between walls 4 and 5.

Walls 6 and 7 are opposite and substantially parallel to walls 8 and 9 respectively. Wall 7 is higher than wall 9. More specifically, walls 6 and 8 extend between walls 7 and 9, and taper from wall 7 to wall 9. Openings are formed in walls 6, 7, 8 to insert cables or connectors for connecting components 20 of inverter assembly 1 electrically, as shown in the FIG. 1 diagram of the hybrid drive. Walls 6, 7, 8 of supporting body 2 also laterally define at least part of a volume 10 housing components 20 for cooling.

Inverter assembly 1 also comprises a top and bottom half-casing 11, 12 (FIG. 2) located on opposite sides of walls 4 and 5 to volume 3.

In the example shown, half-casing 11, face 4A, and the portions of walls 6, 7, 8 on the opposite side of face 4A to volume 3 define volume 10 housing components 20.

Half-casings 11 and 12 are fixed removably to walls 6, 7, 8, 9, and impart a parallelepiped shape to supporting body 2 as a whole.

In the embodiments shown, the geometry of the lateral walls of the supporting body is advantageously designed to permit easy access to walls 4 and 5 to assemble components 20. More specifically, in the embodiment shown, lateral wall 9 laterally defines volume 3, through which the cooling fluid flows, but not volume 10 housing components 20. So, when half-casings 11 and 12 are not fixed to supporting body 2, volume 10 is easily accessible to assemble components 20.

Supporting body 2 also comprises an inlet 13 connected hydraulically to a pump (not shown) to feed cooling fluid into volume 3; and an outlet 14 for draining the cooling fluid flowing through volume 3.

In use, the heat produced, during operation of propulsion system 100 of the vehicle, by components 20 of inverter assembly 1, which are fixed inside dead seats 17 and/or holes 21 in the supporting body, is removed by feeding into volume 3 an appropriate amount of cooling fluid, e.g. water. The cooling fluid may be regulated according to the amount of heat generated. More specifically, the cooling fluid is pumped through inlet 13 into volume 3, flows through volume 3, and is drained from outlet 14 on the opposite side.

As the cooling fluid flows through volume 3, the cooling fluid flows over the walls of volume 3, and in particular over face 5A with fins 16, and over face 4B, and so removes from volume 3 the heat yielded to it by components 20 fixed to walls 4 and 5 of supporting body 2.

Cooling fluid flow through volume 3 may advantageously be made more circuitous by deflectors 15 described above, which, in use, direct the cooling fluid inside volume 3 along a preferential, non-straight, e.g. zig-zag, path between inlet 13 and outlet 14.

This reduces the likelihood of the cooling fluid being distributed unevenly within volume 3, and stagnating in certain areas, thus reducing heat exchange efficiency.

In addition to enabling faster, easier assembly of components 20 to supporting body 2, dead seats 17 also define thinner portions of wall 4 (i.e. of first wall 4 of supporting body 2), which reduce the heat-conduction resistance of wall 4. Reducing the heat-conduction resistance of wall 4 improves thermal coupling of components 20 and supporting body 2 and, indirectly, cooling of components 20 by the cooling fluid flowing through volume 3.

Figure 10:
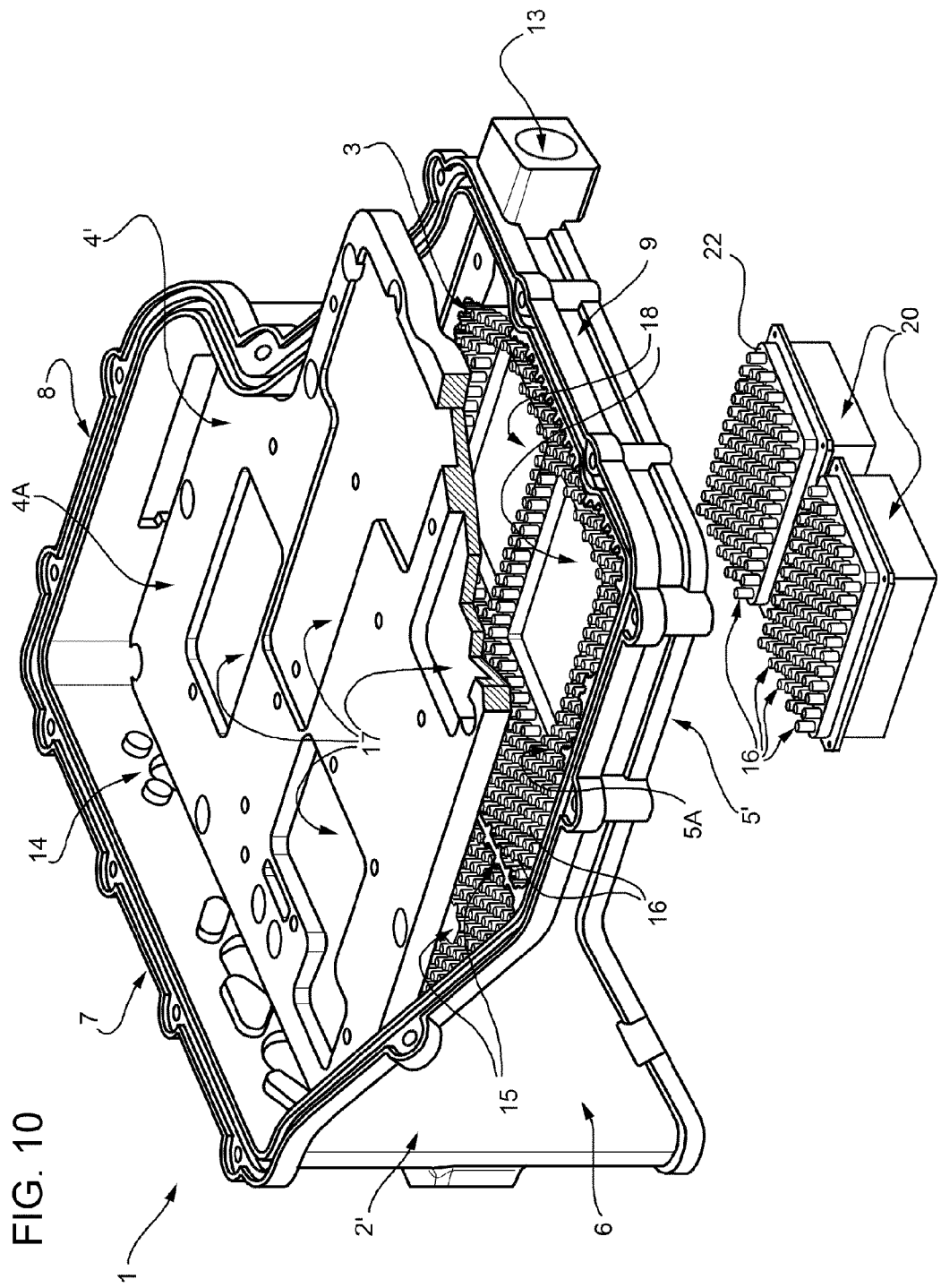
FIG. 10 shows a view in perspective of a second embodiment of the inverter assembly.

Number 2' in FIG. 10 indicates the supporting body of an inverter assembly 1' in accordance with a further embodiment of the invention.

Inverter assembly 1' is similar to inverter assembly 1, and is only the differences between the inverter assembly 1 and 1' are described below. Any corresponding or equivalent parts of inverter assemblies 1, 1' are indicated, where possible, using the same reference numbers.

Wall 5' of supporting body 2' has through seats 18 in which components 20 may be fixed. Components 20 may be fixed in seats 18 so that components 20 face inwards of volume 3. In use, one surface of components 20 is directly flowed over by the cooling fluid.

In this second embodiment, components 20 are housed hermetically inside through seats 18. For example, a seal may be inserted between the periphery of components 20 and the edges of through seats 18.

Components 20 each have a surface 22, over which cooling fluid flows in use, and which has fins 16, identical to those of face 5A of supporting body 2, to increase the direct heat exchange surface between the cooling fluid and components 20.

Operation of inverter assembly 1' is described below only insofar as it differs from that of inverter assembly 1.

The cooling fluid pumped into volume 3 flows directly over the surfaces of components 20 housed in through seats 18, thus improving heat exchange efficiency by eliminating the conduction heat exchange component involved in the first embodiment by interposing wall 4 or 5 between components 20 and the cooling fluid. Providing fins 16 on surfaces 22 of components 20 exposed to the cooling fluid further improves heat exchange efficiency by increasing the heat exchange surface.

The advantages of inverter assembly 1, 1' according to embodiments of the present invention will be clear from the above description.

Compared with solutions employing a coil to cool components 20, inverter assembly 1, 1' according to embodiments of the invention provide for more effective heat exchange by greatly increasing the heat exchange surface per unit of volume.

Moreover, as it flows through volume 3 of the inverter assembly according to embodiments of the invention, the cooling fluid undergoes much smaller load losses than a cooling coil, on account of the much larger flow section and, at the same time, the shorter distance the cooling fluid has to travel. Smaller load losses mean less energy is expended in circulating the cooling fluid, which reduces the overall energy cost of the vehicle.

Inverter assembly 1, 1' according to embodiments of the invention, features a built-in heat dissipater substantially defined by supporting body 2 to which components 20 for cooling are fixed, and that is coupled thermally with both the components themselves and a cooling fluid.

Inverter assembly 1, 1' is therefore highly compact and lightweight, and so aids in improving vehicle performance in terms of energy efficiency, consumption, and environmental impact.

Heat exchange with the flowed-over surfaces is made more effective by deflectors 15, which reduce the likelihood of stagnation.

Heat exchange with the flowed-over surfaces is also made more effective by fins 16, which greatly increase the heat exchange surface and turbulent flow of the cooling fluid.

Because volume 10 housing components 20 is bounded by half-casing 11, wall 4, and portions of walls 6, 7, 8, inverter assembly 1, 1' is extremely easy to assemble.

Clearly, changes may be made to inverter assembly 1, 1' as described and illustrated herein without, however, departing from the scope of the accompanying Claims.

In particular, inverter assembly 1, 1' may be applied to an all-electric, possibly mains-powered, vehicle.

Walls 4 and 5 may, for example, be formed integrally with supporting body 2.

In another variation, one component 20 may define all or most of wall 5.

The invention claimed is:

1. An automotive inverter assembly, comprising:
at least one component to be cooled; and a supporting body for supporting said at least one component, said supporting body defining at least part of a volume through which a cooling fluid that is coupled thermally with said at least one component to be cooled can flow, said supporting body including:
a first and a second wall opposite each other and defining at least part of said volume; and
a number of fins facing inwards of said volume so as to be flowed over by said fluid, said fins being carried by at least one of said first or second walls, some of said fins form at least two groups welded to each other by a weld interposed between the at least two groups to form a deflector, the weld configured to direct said fluid, flowing inside said volume, onto said fins.

2. The automotive inverter assembly as claimed in claim 1, wherein said deflector comprises at least one partition interposed between said first and said second walls.

3. The automotive inverter assembly as claimed in claim 1, wherein at least one of said first or said second walls comprises a through seat engaged hermetically by said at least one component to be cooled.

4. The automotive inverter assembly as claimed in claim 1, wherein said at least one component to be cooled faces at least partly inwards of said volume so as to be flowed over by said fluid.

5. The automotive inverter assembly as claimed in claim 4, wherein said at least one component is fitted integrally with a number of said fins, which face inwards of said volume so as to be flowed over by said fluid.

6. The automotive inverter assembly as claimed in claim 1, wherein at least one of said first or said second walls comprises, on the opposite side to said volume, at least one dead seat engaged at least partly by said at least one component to be cooled.

7. The automotive inverter assembly as claimed in claim 1, wherein said first and said second wall are connected releasably and hermetically to each other along respective peripheries.

8. The automotive inverter assembly as claimed in claim 1, wherein said first and said second walls are integral with each other.

9. The automotive inverter assembly as claimed in claim 1, wherein said supporting body comprises a number of lateral walls crosswise to said first and second walls; and at least one half-casing connected releasably to said lateral walls and defining, with one of said first and second walls and with said lateral walls, a volume housing said at least one component.

10. The automotive inverter assembly as claimed in claim 1, wherein said at least one component comprises at least one electronic component.

11. The automotive inverter assembly as claimed in claim 1, wherein said at least one component comprises an IGBT module.

12. A vehicle propulsion system, comprising:
at least a traction electric machine; and
an automotive inverter assembly for powering said electric machine; said automotive inverter assembly comprising:
at least one component to be cooled; and
a supporting body for supporting said at least one component, said supporting body defining at least part of a volume through which a cooling fluid that is coupled thermally with said at least one component to be cooled, said supporting body including:

a first and a second wall opposite each other and defining at least part of said volume; and a number of fins facing inwards of said volume so as to be flowed over by said fluid, said fins being carried by at least one of said first or second walls, some of said fins form at least two groups welded to each other by a weld interposed between the at least two groups to form a deflector, the weld configured to direct said fluid, flowing inside said volume, onto said fins.

13. The propulsion system as claimed in claim 12, further comprising a voltage generator chargeable by connection to an electric mains and for powering said inverter assembly.

14. A hybrid vehicle, comprising a propulsion system as claimed in claim 13.

* * * * *